(12) United States Patent
Schell

(10) Patent No.: US 6,983,025 B2
(45) Date of Patent: Jan. 3, 2006

(54) HIGH QUALITY POWER RAMPING IN A COMMUNICATIONS TRANSMITTER

(75) Inventor: Stephan V. Schell, San Francisco, CA (US)

(73) Assignee: Tropian, Inc., Cupertino, CA (US)

( * ) Notice: Subject to any disclaimer, the term of this patent is extended or adjusted under 35 U.S.C. 154(b) by 472 days.

(21) Appl. No.: 09/833,967

(22) Filed: Apr. 11, 2001

(65) Prior Publication Data

US 2002/0176514 A1 Nov. 28, 2002

(51) Int. Cl.
H04L 25/03 (2006.01)

(52) U.S. Cl. .................................................... 375/296
(58) Field of Classification Search ................. 375/261, 375/298, 300, 302, 303, 308, 305, 296, 297, 375/295; 332/103; 330/10; 455/63.1, 67.13, 455/68, 127.1, 127.2
See application file for complete search history.

(56) References Cited

U.S. PATENT DOCUMENTS

| 4,706,262 A | | 11/1987 | Ohta ............................ 375/60 |
| 5,551,067 A | * | 8/1996 | Hulkko et al. ................. 455/88 |
| 5,745,527 A | * | 4/1998 | Kelton et al. ................ 375/308 |
| 5,847,602 A | * | 12/1998 | Su ................................ 330/10 |
| 6,148,040 A | * | 11/2000 | Nguyen et al. .............. 375/326 |
| 6,285,681 B1 | * | 9/2001 | Kolze et al. ................. 370/442 |
| 6,580,901 B1 | * | 6/2003 | Mochizuki ................ 455/127.1 |
| 2002/0168026 A1 | * | 11/2002 | Khoini-Poorfard .......... 375/303 |

FOREIGN PATENT DOCUMENTS

| EP | 0 535 669 A | 4/1993 |
| EP | 0 720 286 A | 7/1996 |
| EP | 0 800 267 | 10/1997 |
| EP | 0 895 363 | 2/1999 |

OTHER PUBLICATIONS

034942–368 European Application No.: 04106195.3; European Search Report 3 pages.

* cited by examiner

Primary Examiner—Don N. Vo

(57) ABSTRACT

The present invention, generally speaking, provides for control of a modulator, such as a polar modulator or conventional linear modulator, to produce high quality RF signals that ramp quickly from a condition of minimal output power to a condition of information-bearing modulation at a specified output power and back down to the condition of minimal output power. Using a polar modulator, for example, it is theoretically possible to perform ramping without degrading the transient measurements beyond the degradation caused by the information-bearing modulation itself. This ideal can be closely approached in practice. Such ramping can be achieved without the need for extensive unit-by-unit calibration on the manufacturing line.

33 Claims, 10 Drawing Sheets

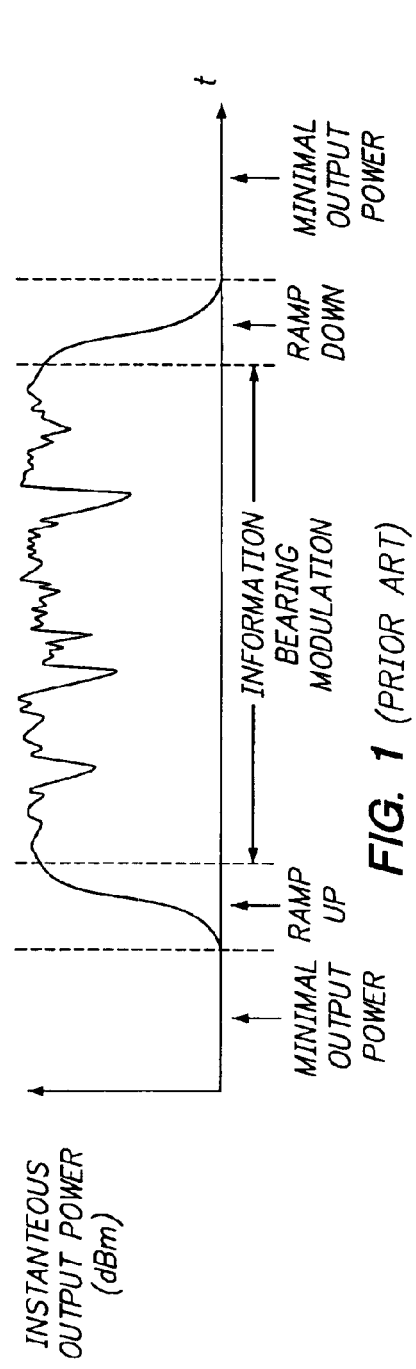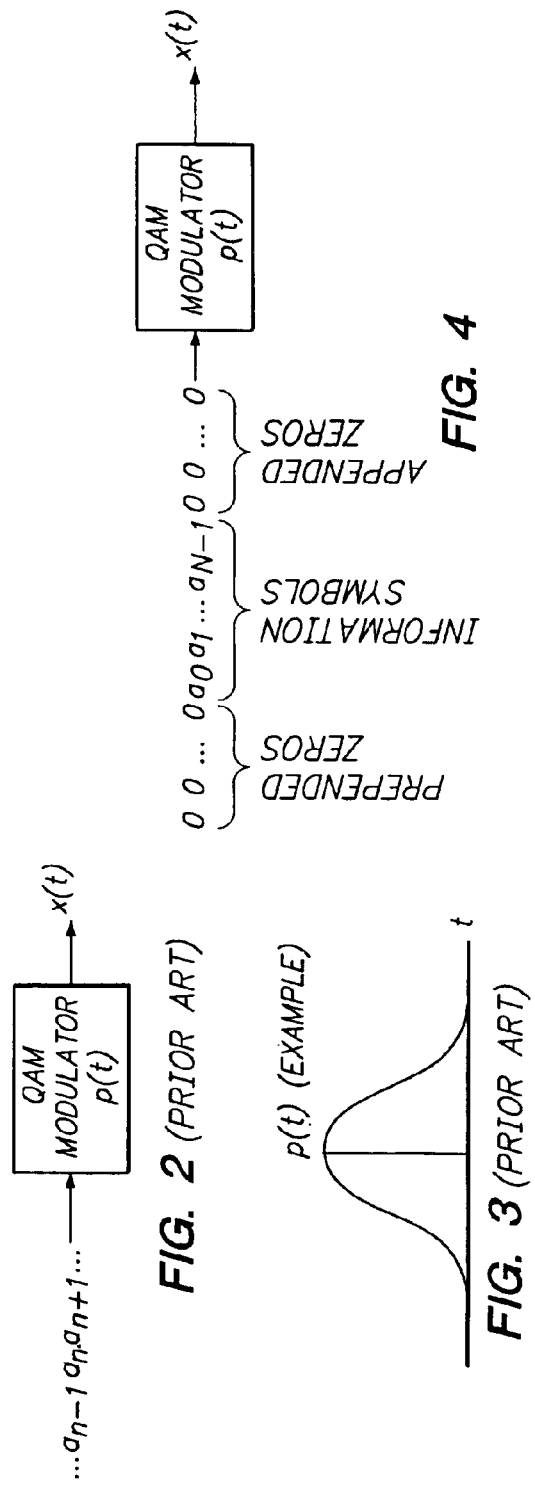

HIGH QUALITY POWER RAMPING IN A COMMUNICATIONS TRANSMITTER

BACKGROUND OF THE INVENTION

1. Field of the Invention

The present invention relates to power ramping in a communications transmitter.

2. State of the Art

High quality RF (radio frequency) signals must ramp quickly from a condition of minimal output power to a condition of information-bearing modulation at a specified output power and back down to the condition of minimal output power. Such power ramping capability, illustrated in FIG. 1, is required for transmitters in many time division multiple access (TDMA) communication systems. Example systems include those specified by the GSM and ANSI-136 standards, and combinations of the same (so-called multi-mode systems).

A fundamental requirement of these transmitters is that the acts of ramping up and ramping down must not violate specified limits on peak power in spectral bands away from the assigned RF channel (e.g., bands that would be allocated to other transmitters); the associated measurement is called the transient spectrum in some systems or the transient adjacent channel power (transient ACP) in others.

Present power ramping techniques must be tailored for each modulation type, and typically require unit-by-unit calibration (at least in the case of typical GMSK transmitters and conventional multi-mode transmitters). Even so, transient ACP performance is usually very sub-optimal.

The present invention is applicable to both conventional (I/Q) and polar modulation architectures. Polar modulation architectures, and similar architectures in which separate amplitude and phase paths are provided, are described, for example, in U.S. Pat. Nos. 6,191,653, 6,194,963, 6,078,628, 5,705,959, 6,101,224, 5,847,602, 6,043,707, and 3,900,823, as well as French patent publication FR 2768574, all of which are incorporated herein by reference.

SUMMARY OF THE INVENTION

The present invention, generally speaking, provides for control of a modulator, such as a polar modulator or conventional linear modulator, to produce high quality RF signals that ramp quickly from a condition of minimal output power to a condition of information-bearing modulation at a specified output power and back down to the condition of minimal output power. Using a polar modulator, for example, it is theoretically possible to perform ramping without degrading the transient measurements beyond the degradation caused by the information-bearing modulation itself. This ideal can be closely approached in practice. Such ramping can be achieved without the need for extensive unit-by-unit calibration on the manufacturing line.

BRIEF DESCRIPTION OF THE DRAWING

The present invention may be further understood from the following description in conjunction with the appended drawing. In the drawing:

FIG. 1 is a diagram illustrating power ramping in a communication system;

FIG. 2 is a diagram illustrating operation of a conventional QAM modulator using a pulse shaping filter having an impulse response given by p(t);

FIG. 3 is a diagram of one example of p(t);

FIG. 4 is a diagram illustrating operation of a QAM modulator using prepended and appended zero-valued symbols to control ramping;

DETAILED DESCRIPTION OF THE PREFERRED EMBODIMENTS

For nearly all systems of interest, the complex envelope x(t) of an information-bearing modulation can be expressed by the well-known equation $$x(t) = \sum_n a_n p(t - nT)$$

which is equivalent to $$x(nT + \tau) = \sum_{k=0}^{L} a_{n-k} p(kT + \tau)$$

where $a_n$ is the n-th complex-valued symbol (typically drawn from a discrete constellation), p(t) is the impulse response at time t of a pulse-shaping filter, and T is the symbol period. Time t can be either continuous or discrete. Operation of a conventional QAM modulator using a pulse shaping filter having an impulse response given by p(t) is illustrated in FIG. 2. Due to the desire to maintain spectral efficiency, p(t) is typically a smooth pulse-like function as shown for example in FIG. 3.

An important observation, previously unknown either with respect to polar modulators or conventional modulators, is exploited in accordance with the present invention to achieve ramping having the advantageous characteristics previously mentioned. It is that by prepending and appending a few zero-valued symbols to the finite-length sequence of information symbols belonging to a burst, the resulting complex envelope x(t) naturally ramps up and down precisely as required. Furthermore, it can be shown mathematically that the transient spectral properties of x(t) during these ramps are no worse than during the information-bearing modulation. A diagram illustrating operation of a QAM modulator using prepended and appended zero-valued symbols to control ramping is shown in FIG. 4.

Figure 5:
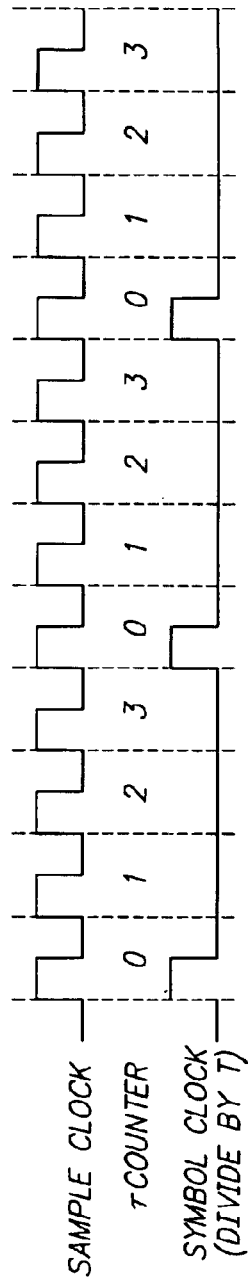
FIG. 5 is a timing diagram of timing signal used in with the circuitry of FIG. 6.
Figure 6:
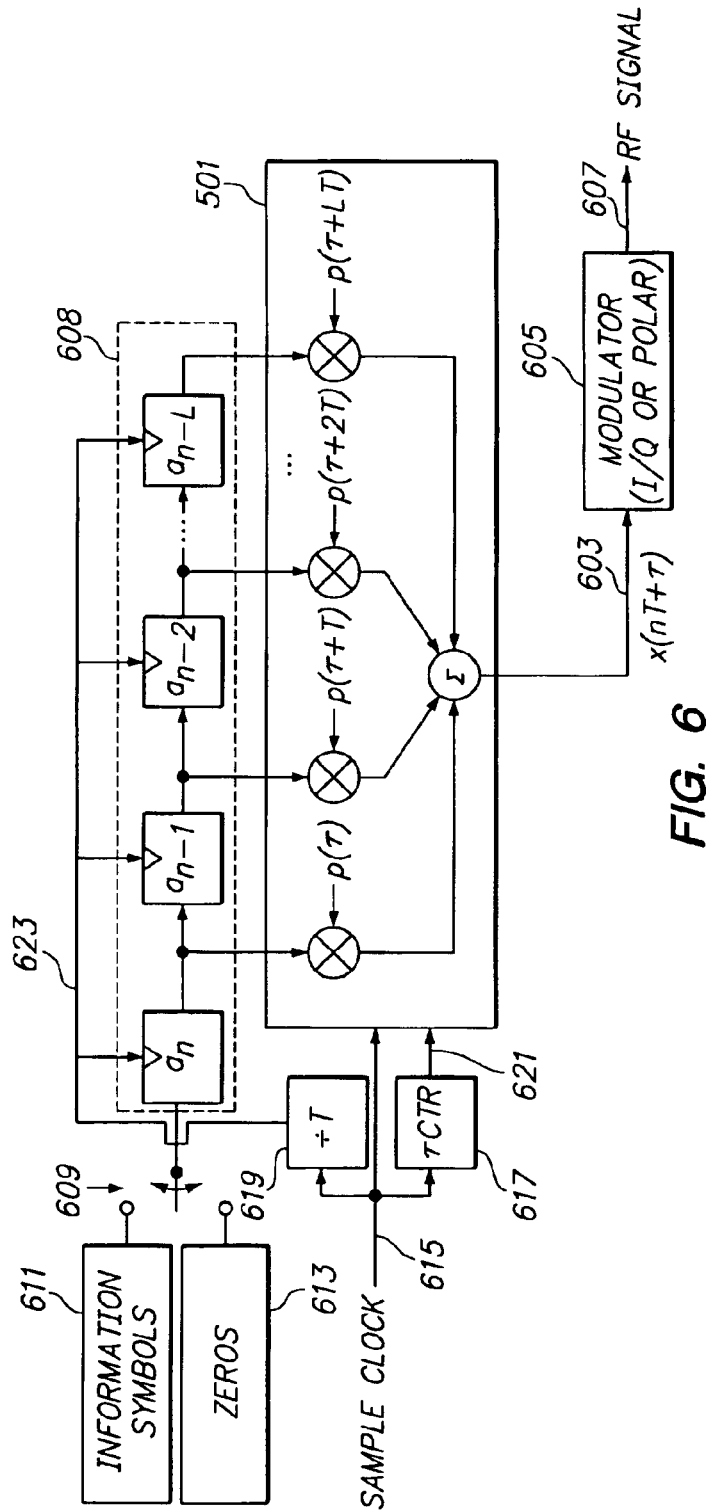
FIG. 6 is a diagram of a portion of a transmitter including ramp control circuitry in accordance with an exemplary embodiment of the invention.

FIG. 6 shows a portion of a transmitter including ramp control circuitry in accordance with an exemplary embodiment of the invention. Prior to describing the circuitry of FIG. 6, it will be useful to understand the relationship of certain timing signals used in the circuitry of FIG. 6. These timing signals are shown in FIG. 5. A sample clock signal is divided by some number T to obtain a symbol clock. A $\tau$ counter counts the sample clock pulse within one period of the symbol clock. In the example of FIG. 5, T=4.

Referring now to FIG. 6, a pulse shaping filter 601 having impulse response coefficients p(0), p(1), . . . , p((L+1)T−1) receives from a tapped delay line or shift register a group of symbols $a_n$, $a_{n-1}$, $a_{n-2}$, . . . , $a_{n-L}$. (For purpose of the present description, a shift-register implementation will be assumed.) As $\tau$ cycles through 0, 1, 2, . . . , T−1, the indices $\tau$, $\tau+T$, $\tau+2T$, . . . , $\tau+LT$ select a subset of the impulse response coefficients for application within the circuit at a particular time. The subsets of impulse response coefficients applied at a particular time may be described as follows: at $\tau=0$, the subset is {0, 1, . . . , T−1 }; at $\tau=1$, the subset is {T, T+1, . . . , 2T−1}; at $\tau=2$, the subset is {2T, 2T+1, . . . , 3T−1}, and so fourth, until at $\tau=T-1$, the subset is {T−1, T−1+T, T−1+2T, . . . , T−1+LT}. Hence, as $\tau$ cycles through 0, 1, 2, . . . , T−1, the entire range of impulse response coefficients p(0), p(1), . . . p((L+1)T−1) will have been applied.

The pulse filter forms an output signal 603 given by x(nT+$\tau$), which is modulated using an I/Q modulator or polar modulator 605 to form an RF signal 607. Prepending and appending of zero-valued symbols for ramp control is accomplished by inputting values to a shift register 608 through an input selector or switch 609, connected to either a source of information symbols 611 or to a source of zero values 613. A sample clock 615 is input directly to the pulse-shaping filter, and is input also to a $\tau$ counter 617 and a divide-by-T counter 619. The $\tau$ counter produces a count 621 that is input to the pulse-shaping filter. The divide-by-T counter produces from the sample clock a symbol clock 623 that is input to the shift register and applied to clock the individual stages of the shift register.

In operation, upon receipt of the first information-bearing symbol $a_0$, the initial state (n=0) of the shift register is $a_{n-1}=a_{n-2}=\ldots=a_{n-L}=0$. As additional symbols are received, they are shifted into the shift register. With each tick of the sample clock, the counter or index r is updated, modulo T; $\tau$ therefore cycles through the sequence 0, 1, . . . , T−1, 0, 1, . . . , T−1, . . . . After the last information symbol enters the shift register, the input selector switches to accept zeros during the next L ticks of the symbol clock, until the shift register state is $a_n=\ldots=a_{n-L+1}=0$ and $a_{n-L}=a_{N-1}$, where N is the number of symbols in a burst. In this state, the ramp-down is complete once $\tau=T-1$ is reached.

Figure 7:
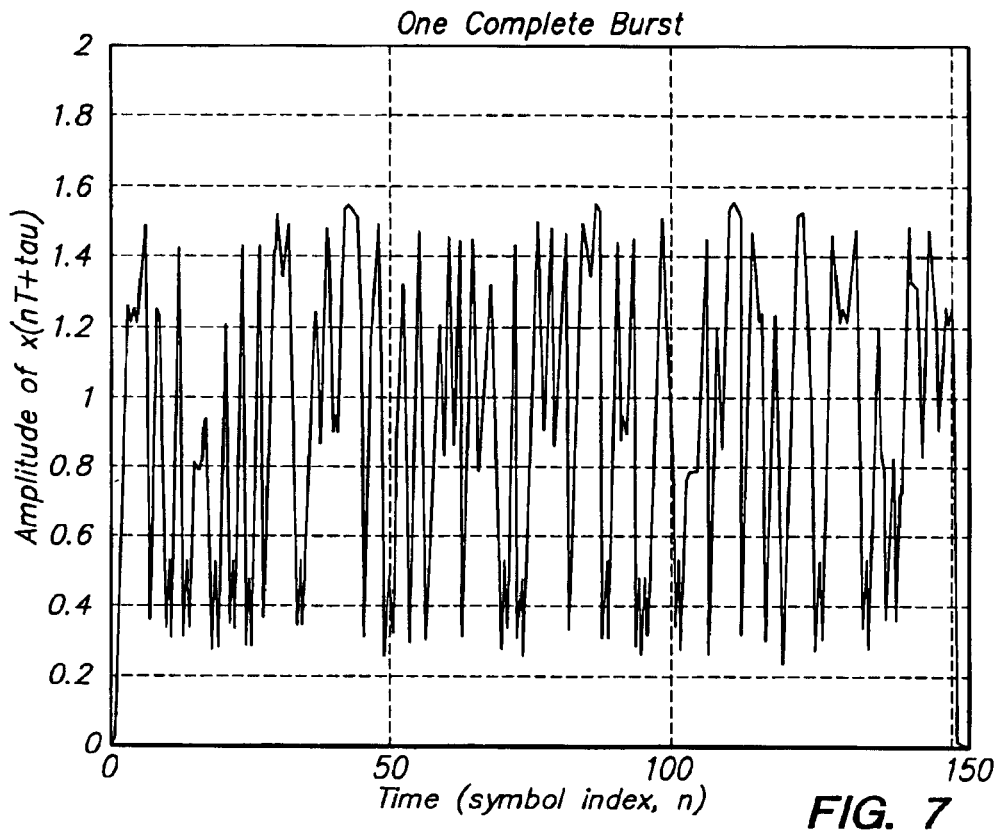
FIG. 7 is a signal plot of results obtained using the ramp control circuit of FIG. 6.
Figure 8:
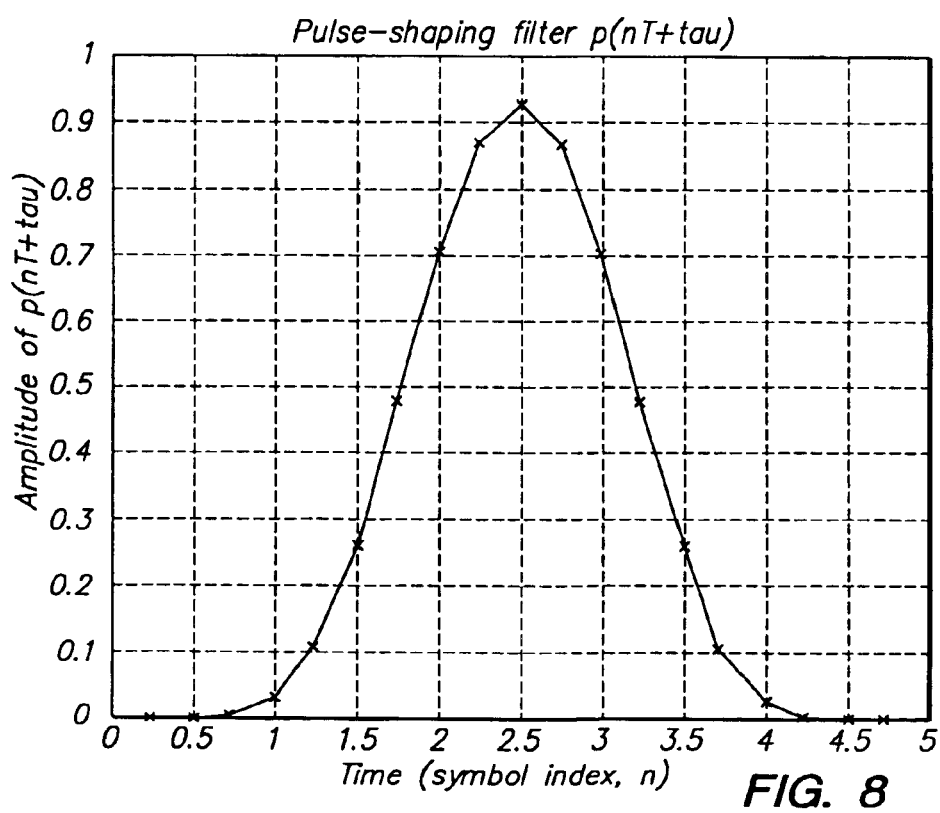
FIG. 8 is a diagram of a pulse shaping filter function p(t) used in the example of FIG. 7.

Results of this technique for one complete burst with N=148 symbols are shown in the plot of FIG. 7. In this example, an EDGE pulse, illustrated in FIG. 8, was used, with T=4 (i.e., four samples per symbol) and L+1=5 (i.e., a shift register of length five).

Figure 9:
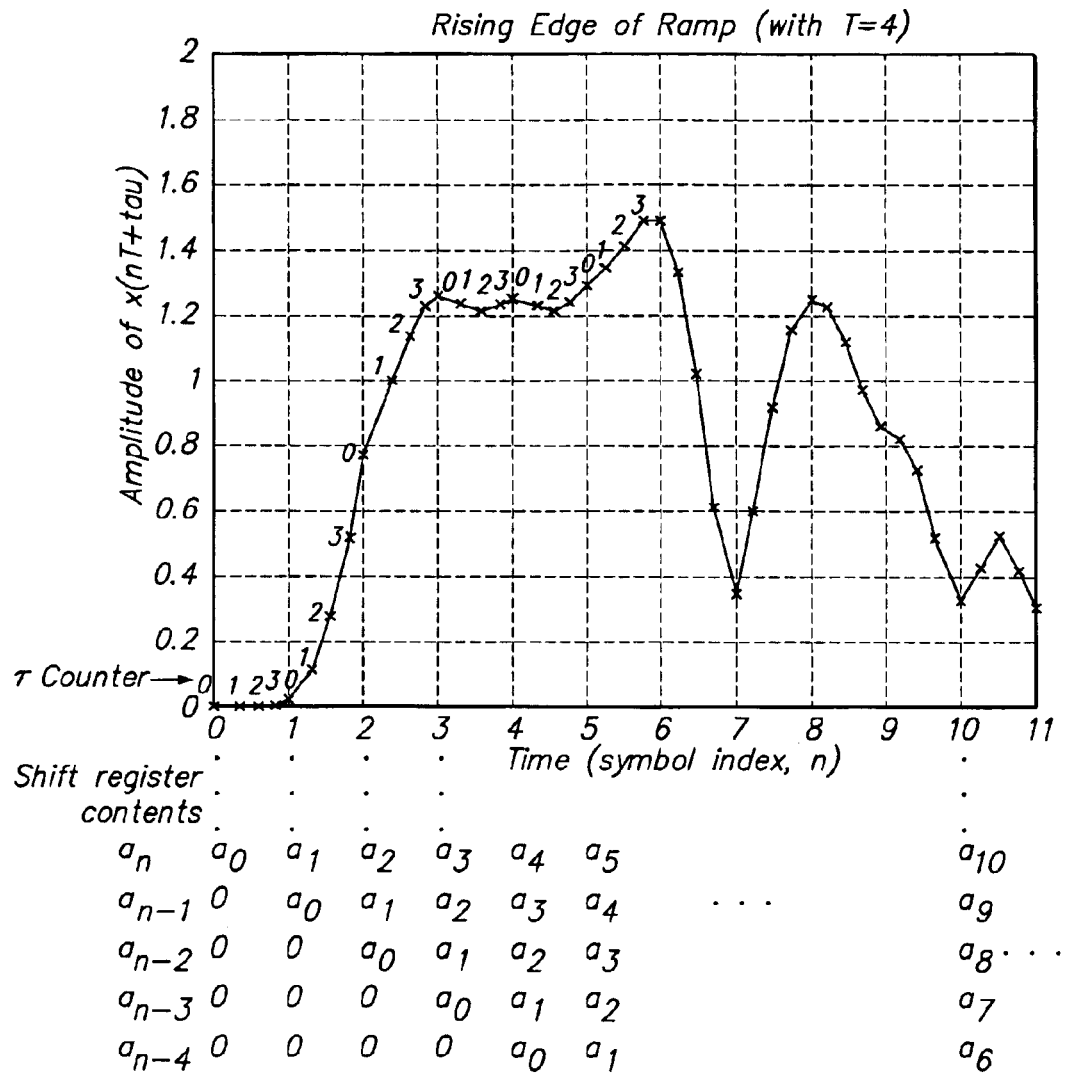
FIG. 9 is an exploded view of the rising edge of the ramp of a signal plot like that of FIG. 7.

FIG. 9 shows an exploded view of the rising edge of the ramp of a signal plot like that of FIG. 7, annotated to show the value of the $\tau$ counter at each output sample, along with the contents of the shift register, updated as each new symbol is input. Note that the ramp up is basically complete within three symbols periods of the first information symbol entering the shift register.

Figure 10:
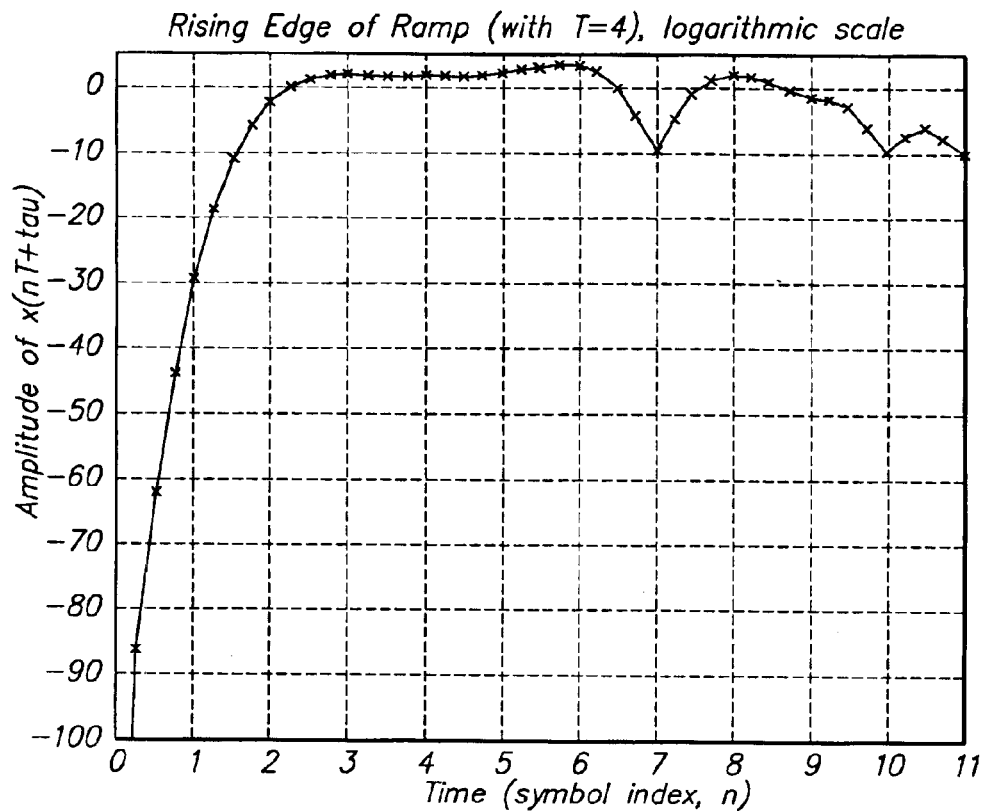
FIG. 10 shows the rising edge of the ramp of FIG. 9 when viewed on a logarithmic (dB) scale.

FIG. 10 shows the rising edge of the ramp when viewed on a logarithmic (dB) scale. Here it can be seen that the signal amplitude during the first symbol period is over 40 dB down from the peak. In most systems (including those complying with the EDGE specification), such small signal components can be significantly distorted (e.g., clamped at zero) without causing measurable degradation of system performance (e.g., transient ACP). Various power amplifier control signals can therefore be abruptly switched during such low-amplitude times without performance degradation, described in greater detail hereinafter.

Figure 11:
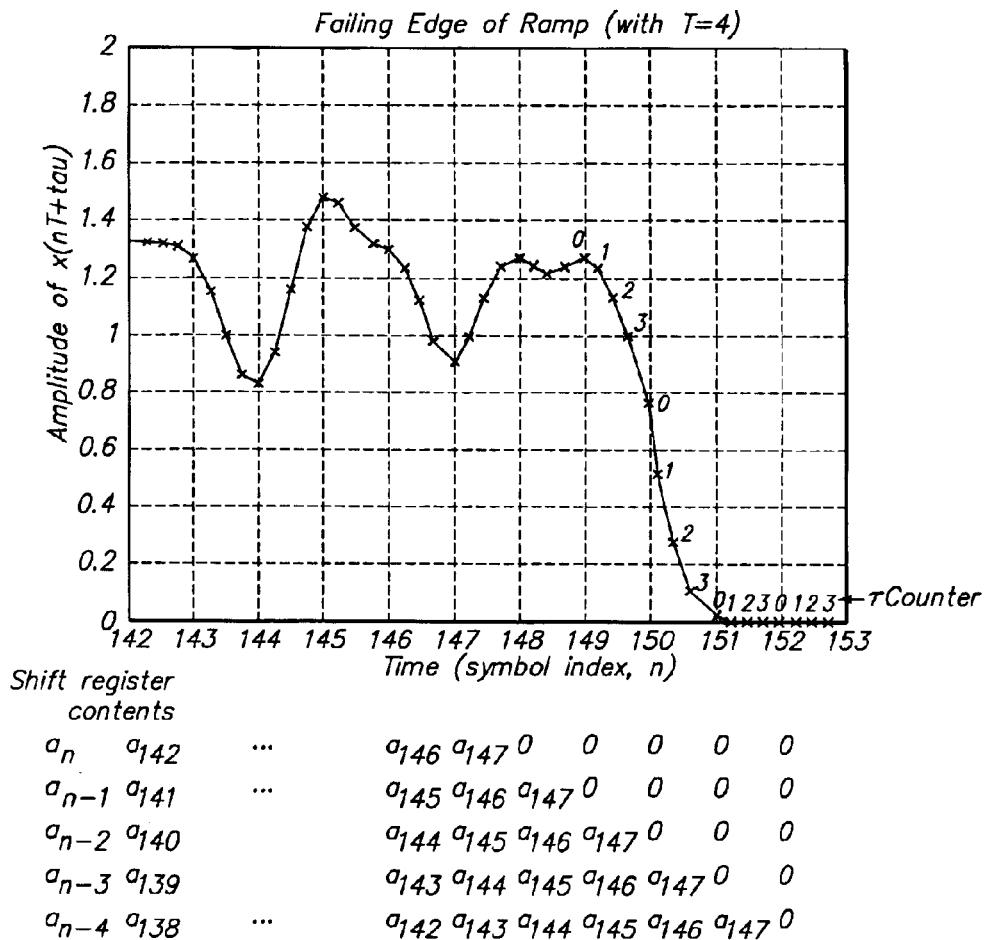
FIG. 11 is similar to FIG. 9 but shows the falling edge of the ramp.

FIG. 11 is similar to FIG. 9 but shows the falling edge of the ramp, with zero-valued symbols entering the shift register after the last information symbol. This appending of zero-valued symbols is accomplished in the example embodiment of FIG. 6 when the input selector switches to the zero source, after the symbol clock at index n=147 but before the next symbol clock at n=148.

Figure 12:
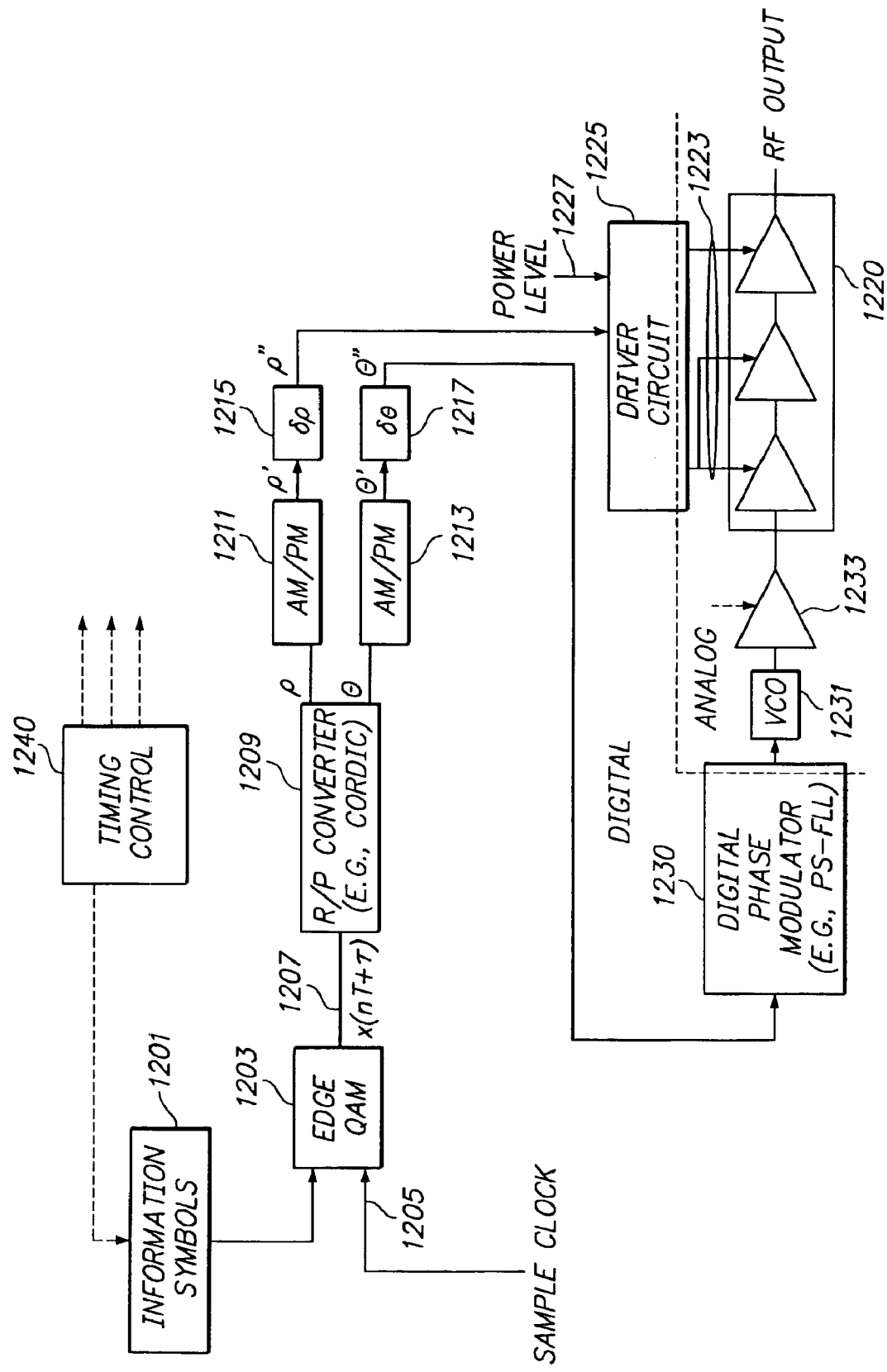
FIG. 12 is a block diagram illustrating application of the present ramping technique in a polar modulation architecture.

FIG. 12 is a block diagram illustrating application of the present ramping technique in a polar modulator architecture, i.e., one having separate amplitude and phase paths. A symbol source 1201 inputs data symbols to a pulse modulator 1203, such as an EDGE QAM modulator, in accordance with a symbol clock 1205. The modulator produces an envelope signal 1207, for example an envelope signal like that of FIG. 7, given by x(nT+$\tau$). The envelope signal is processed by a rectangular-to-polar converter 1109 (such as a Cordic converter), producing magnitude and phase signals $\rho$ and $\theta$.

In an exemplary embodiment, the latter signals are corrected for non-linearities and are time aligned to account for path delay differences. Hence, the magnitude signal is applied to an AM/AM look-up table 1211, an output $\rho'$ of which is delayed a controlled amount by a magnitude delay element 1213 to produce an output $\rho''$. Similarly, the phase signal is applied to an AM/PM look-up table 1215, an output $\theta'$ of which is delayed a controlled amount by a phase delay element 1217 to produce an output $\theta''$. The delays of the magnitude delay element and the phase delay element are controlled to achieve proper magnitude and phase alignment at an amplification chain 1220.

The amplification chain 1220, in an exemplary embodiment, includes three cascaded stages, realized for example using FET devices. The stages are drain modulated and driven in switch mode or, for low-power operation, in "multiplicative" mode, as described more particularly in U.S. patent application No.09/834,024, entitled "Communications Signal Amplifiers Having Independent Power Control and Amplitude Modulation", filed on even day herewith and incorporated herein by reference. An RF input port 1221 of the amplification chain may be regarded as the phase port, and the drains (or power supply inputs) of the stages may be regarded together as the amplitude port 1223.

The amplitude port is driven by a driver circuit 1225, responsive to the signal $\rho''$ and to a power level input signal 1227.

The phase port is driven by a digital phase modulator 1230, preferably a digital phase modulator having a phasestable frequency locked loop as described in U.S. Pat. No. 6,094,101 of the present assignee, incorporated herein by reference, in combination with a VCO 1231. The digital phase modulator 1230 is isolated from the amplifification chain 1220 using a variable gain amplifier (VGA) or a variable attenuator that is responsive to another power level input signal. Alternatively, the digital phase modulator may be isolated from the power amplifier using a buffer amplifier. These alternative are represented in FIG. 12 by a variable gain amplifier 1233 that may have a gain that is zero (in the case of the buffer amplifier), negative (in the case of an attenuator) or positive.

A timing control block 1240 provides timing signals to the symbol source and to the driver circuit, as well as to the buffer amplifier, if present.

The transmitter of FIG. 12 is mainly digital, the digital and analog (right-portions being separated by a dashed line.

The same principles described thus far, particularly with respect to ramping of the EDGE modulator, may be readily extended to embrace other modulation types, such as IS-136, also known as North American Digital Cellular or D-AMPS. The particulars of D-AMPS, however, require certain modifications to the foregoing approach.

Figure 13:
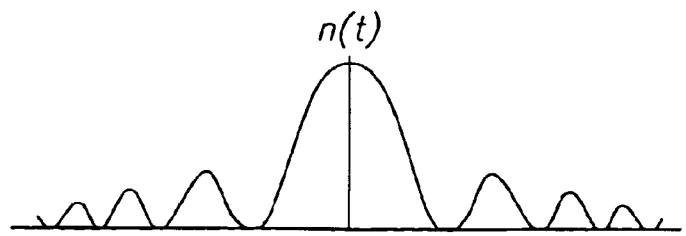
FIG. 13 is a diagram of a pulse shaping filter function n(t) used for D-AMPS.

In particular, the pulse shape used in D-AMPS, shown in FIG. 13, is theoretically of infinite duration (unlike the EDGE pulse, which has a duration of 5 symbol periods). Of course, in practice, this infinite-duration pulse is truncated, the choice of the truncation interval (i.e., interval outside of which the pulse is truncated) determining the spectral characteristics (including ACP and transient ACP) of the output signal. Using the foregoing method of ramping, to obtain low side lobes, a truncation interval in the range of 8–16 symbols periods would be required, corresponding to a ramp-up time in the range of 4–8 symbol periods and a ramp-down time in the range of 4–8 symbols periods. Unfortunately, such prolonged ramp times exceed the 3 symbol period duration specified in the D-AMPS standard. Therefore, in order to use the foregoing method for D-AMPS, or for multiple QAM modulations including EDGE, D-AMPS, etc., a mechanism of ramp acceleration is required whereby the prolonged ramp times of D-AMPS may be shortened to satisfy the specified ramp mask.

Figure 14:
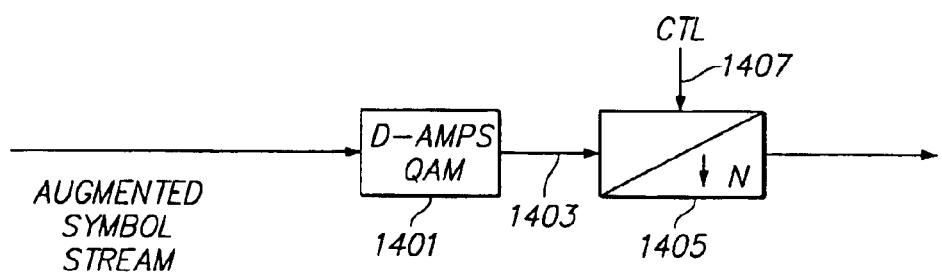
FIG. 14 is a diagram of a portion of a communications transmitter implementing ramping for D-AMPS.

One way of achieving such ramp acceleration is illustrated in FIG. 14. Here, a D-AMPS QAM modulator 1401 is provided, zero-valued symbols being prepended and appended to the information symbols belonging to a burst, as previously described in relation to EDGE. The modulator produces a digital output signal 1403 having a prescribed symbol rate. This digital output signal is applied to a discard unit 1405 controlled by a control signal 1407 from a timing generator (not shown). During ramp-up and ramp-down, a control signal is applied to the discard unit to cause it to discard selected samples (which has the equivalent effect of accelerating the time base). For example, every other sample may be discarded, resulting in 2× acceleration. During the information burst, the discard unit passes the sample stream from the modulator unchanged.

In an exemplary embodiment, the ramp-up and ramp-down times using ramp acceleration are three symbols times in duration, satisfying the specified ramp mask.

Since the signal at the original sampling rate is oversampled and is naturally bandlimited, discarding every other symbol does not create spectral side lobes or aliasing, and does not destroy signal information.

Various other means of accomplishing ramp acceleration will be apparent to those skilled in the art. For example, instead of the discard unit, an arbitrarily variable sample rate converter (sometimes referred to as an asynchronous sample rate converter) of a type known in the art may be used. Using such a sample rate converter, the desired acceleration, instead of being limited to discrete values, may be arbitrarily chosen.

The foregoing methods are not directly applicable to PM or FM (i.e., constant envelope) signals such as the GMSK signal used in GSM, wherein zero-valued symbols do not result in a zero level output signal. However, in the case of the GMSK signal, its ideal spectrum is practically identical to that of the EDGE signal, suggesting that the same ramp shape used for EDGE could also be used for GMSK. In one particular embodiment, the first half of the EDGE pulse, $p(0), p(1), \ldots, p(2.5T)$, is used as the GMSK ramp shape for ramp up, and the rest of the EDGE pulse, $p(2.5T), p(2.5T+1), \ldots, p(4T+T-1)$, is used as the GMSK ramp shape for ramp down. The EDGE pulse has the characteristic that the squared magnitude of its Fourier transform is approximately proportional to the power spectrum of the GMSK communications signal.

Figure 15:
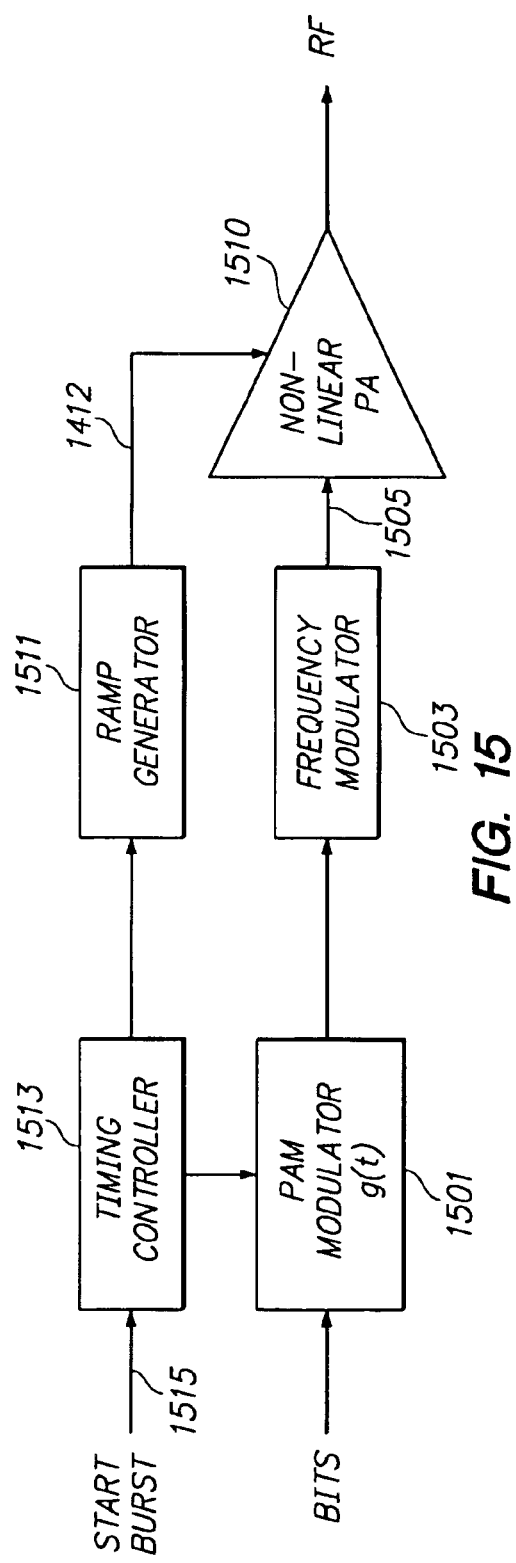
FIG. 15 is a block diagram illustrating GMSK ramping in a polar modulation architecture.

FIG. 15 illustrates application of the foregoing ramping technique for GMSK in a polar architecture having separate amplitude and phase paths. A phase path includes a GMSK PAM modulator 1501 and a frequency modulator 1503, the combination of which generates the final GMSK signal 1405. (The PAM modulator has a pulse shaping filter with an impulse response g(t) tailored for GMSK.) The PAM modulator receives bits from a bit source (not shown). The bits are used by the PAM modulator and the frequency modulator to generate the GMSK signal 1505, which is applied to a phase port of a non-linear power amplifier (PA) 1510. An amplitude path includes a "hard-coded" ramp generator 1511 that uses values from the EDGE pulse p(t) as previously described to generate a ramp signal 1512 that is applied to an amplitude port of the PA 1510. A timing controller 1513 receives a Start Burst signal 1515 and generates timing signals for the ramp generator and for the PAM modulator. In particular, the ramp generator and the PAM modulator are activated such that by the time an information bearing signal is applied to the phase port of the non-linear PA, the RF output signal has been fully ramped up.

By using a non-linear PA, performance variations between production units are predictably small, with the result that the kind of unit-by-unit ramping calibration necessitated in the prior art may be eliminated, an important advantage.

Figure 16:
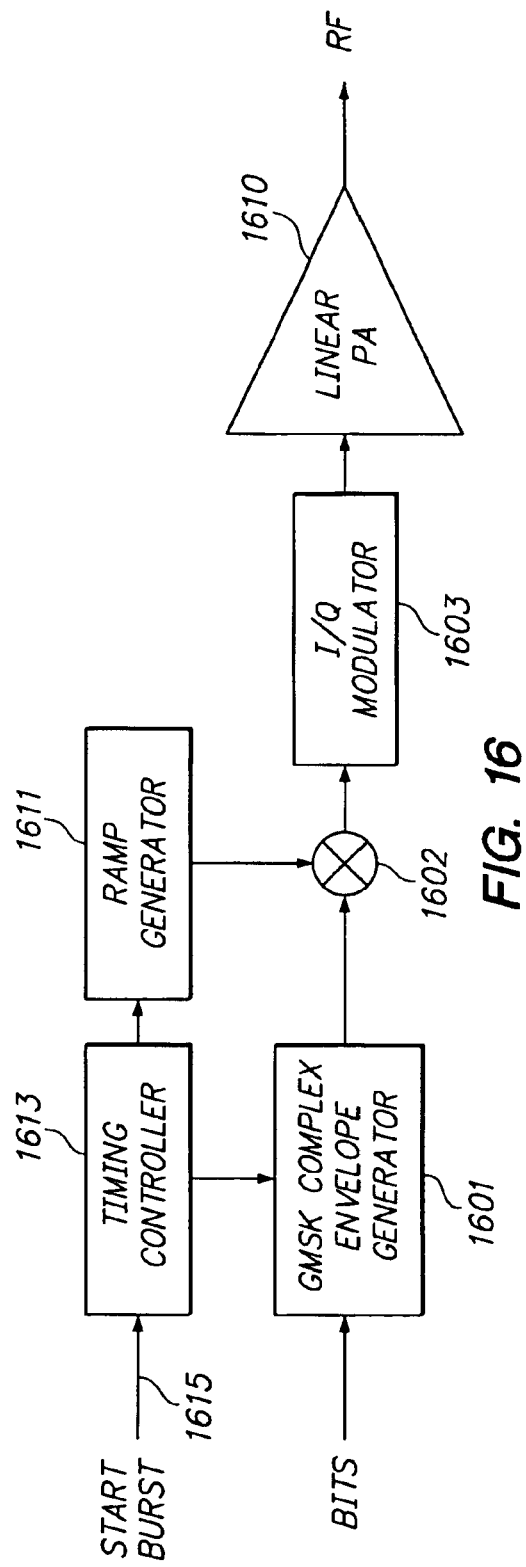
FIG. 16 is a block diagram illustrating GMSK ramping in an I/Q architecture.

FIG. 16 illustrates application of the foregoing ramping technique for GMSK in a conventional I/Q architecture having a single signal path combining amplitude and phase information. In this embodiment, the PAM/FM combination of the embodiment of FIG. 15 are replaced by a GMSK complex envelope generator 1601, a multiplier 1602 and an I/Q modulator 1603. A timing controller 1613 receives a Start Burst signal 1615 and generates timing signals for the ramp generator and for the GMSK complex envelope generator. In particular, the ramp generator and the GMSK complex signal generator are activated such that by the time an information bearing signal is applied to the multiplier 1602, the output signal of the ramp generator has completed a ramp-up portion.

Figure 17:
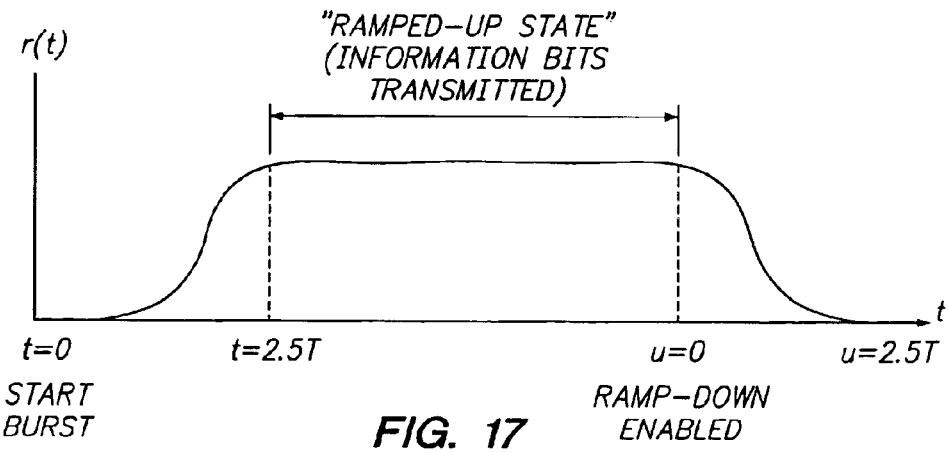
FIG. 17 is a diagram illustrating the output r(t) of the ramp generator in FIG. 15 and FIG. 16.

The output r(t) of the ramp generator of the foregoing embodiments is shown in FIG. 17. The start of a burst corresponds to time t=0, at which time ramping up begins. Ramping up is complete at time t=2.5T, whereupon a "ramped-up" state begins during which information bits are transmitted. At the end of the ramped-up state, a "ramp-down" signal is generated, at a time designated as t=u. The ramp-down state continue until time t=u+2.5T. The output r(t) may therefore be expressed as:

$$r(t) = \begin{cases} p(t), & 0 \le t \le 2.5T \\ p(2.5T), & 2.5T \le t \le u \\ p(2.5T + t - u), & u \le t \le u + 2.5T \end{cases}$$

The duration of the ramped-up state may be defined in a digital logic implementation using a programmable counter, as is apparent to those skilled in the art of digital logic design. Upon expiration of the counter, the ramp-down signal is enabled. Similarly, counters may be used in a simple state machine to generate the indices t and u to be used in looking up values of p(t) used to define r(t). Other means providing equivalent signals r(t) may be used as well.

Instead of storing p(t) values directly on chip, a savings in area may be obtained by instead storing the $N^{th}$-order differences of the sequence of values. To "recall" the original sequence of values, their $N^{th}$-order differences are recalled and processed using an $N^{th}$-order accumulator, the output of which is the sequence of original values.

Ramping for GMSK signals when performed in the foregoing manner is "temporally compact;" i.e., ramp-up and ramp-down occur as quickly as possible consistent with spectral requirements.

The description thus far has described advantageous ramping techniques for varying-envelope signals such as EDGE and D-AMPS and constant-envelope signals such as GMSK. The present invention, in another aspect thereof, enables the generation of high-quality signals with good transient spectrum characteristics in which the modulation may switch (between GMSK and EDGE, for example) from slot to slot. This manner of operation is most readily achieved using polar modulation, enabling true multi-mode operation where mode switching is done on-the-fly, in real time.

Figure 18:
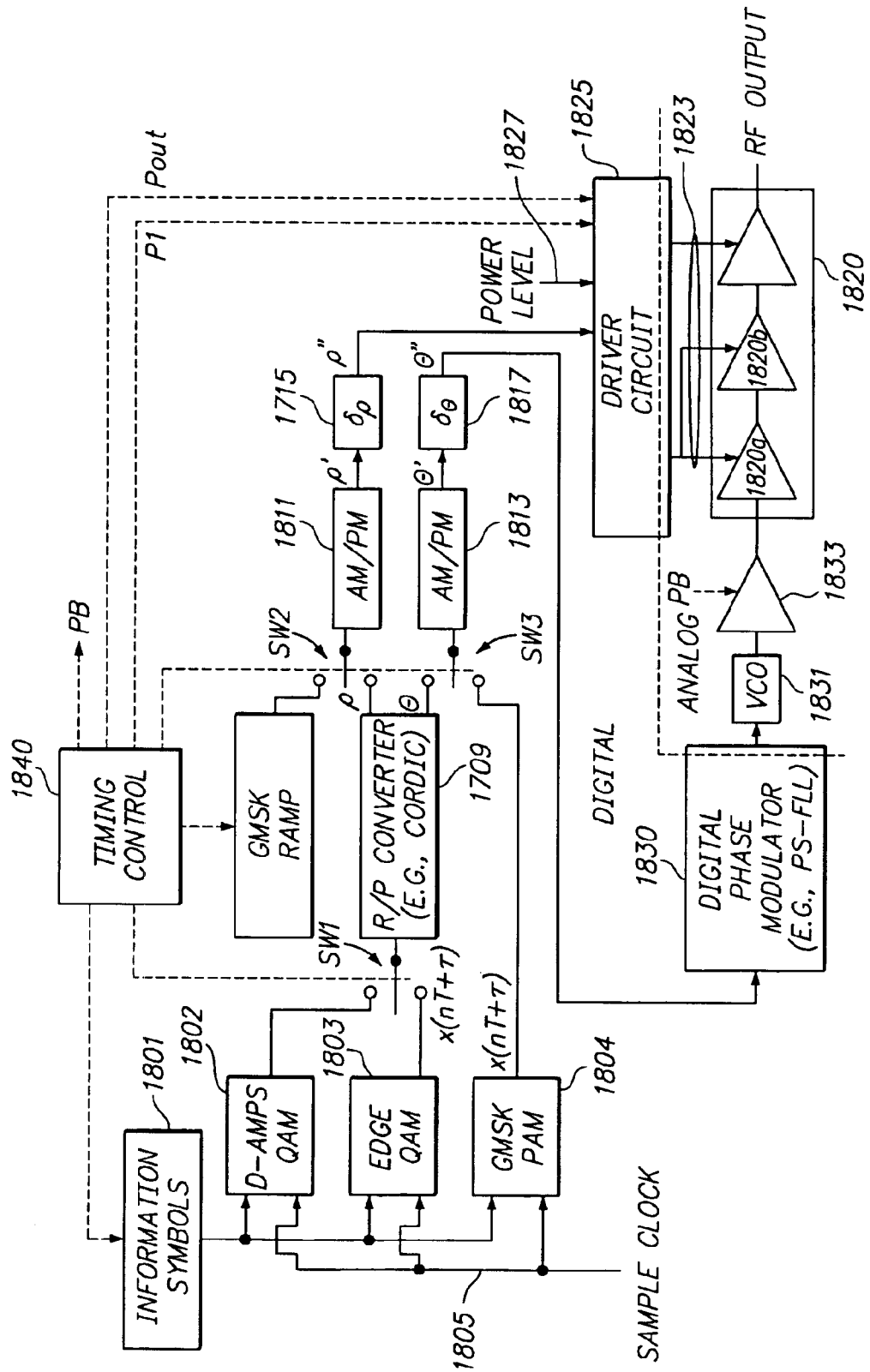
FIG. 18 is a block diagram of a multi-mode transmitter in accordance with the present invention.

FIG. 18 shows a polar modulator architecture like that of FIG. 12, modified for multi-mode operation. In particular, in addition to the EDGE QAM modulator of FIG. 12, a D-AMPS QAM modulator 1802 and a GMSK PAM modulator 1804 are also provided, each receiving symbols from the symbol source 1801 in accordance with the sample clock 1805. A GMSK ramp generator 1710 like that of FIG. 15 and FIG. 16 is also provided.

Moreover, three switches are provided, controlled by the timing generator. One switch SW1 is provided at the input of the R/P converter and selects between outputs of the EDGE QAM modulator (EDGE mode) and the D-AMPS QAM modulator (D-AMPS mode). Another switch SW2 is provided at the input of the AM/AM LUT and selects between an output of the R/P converter (non-GMSK mode, i.e., EDGE or D-AMPS) and an output of the GMSK ramp generator (GMSK mode). Another switch SW3 is provided at the input of the AM/PM LUT and selects between an output of the R/P converter (non-GMSK mode, i.e., EDGE or D-AMPS) and an output of the GMSK PAM modulator (GMSK mode).

The transmitter of FIG. 18, like that of FIG. 12, is mainly digital, the digital and analog portions being separated by a dashed line. Preferably, the digital portion is realized in the form of a single integrated circuit, for example a CMOS integrated circuit.

The characteristics of the ramping profile achieved in accordance with the present invention allow various power amplifier control signals to be abruptly switched during such low-amplitude times without performance degradation. An example of the interaction between ramping and overall control of a non-linear power amplifier in a polar modulation architecture will be described with reference to FIG. 18.

Figure 19:
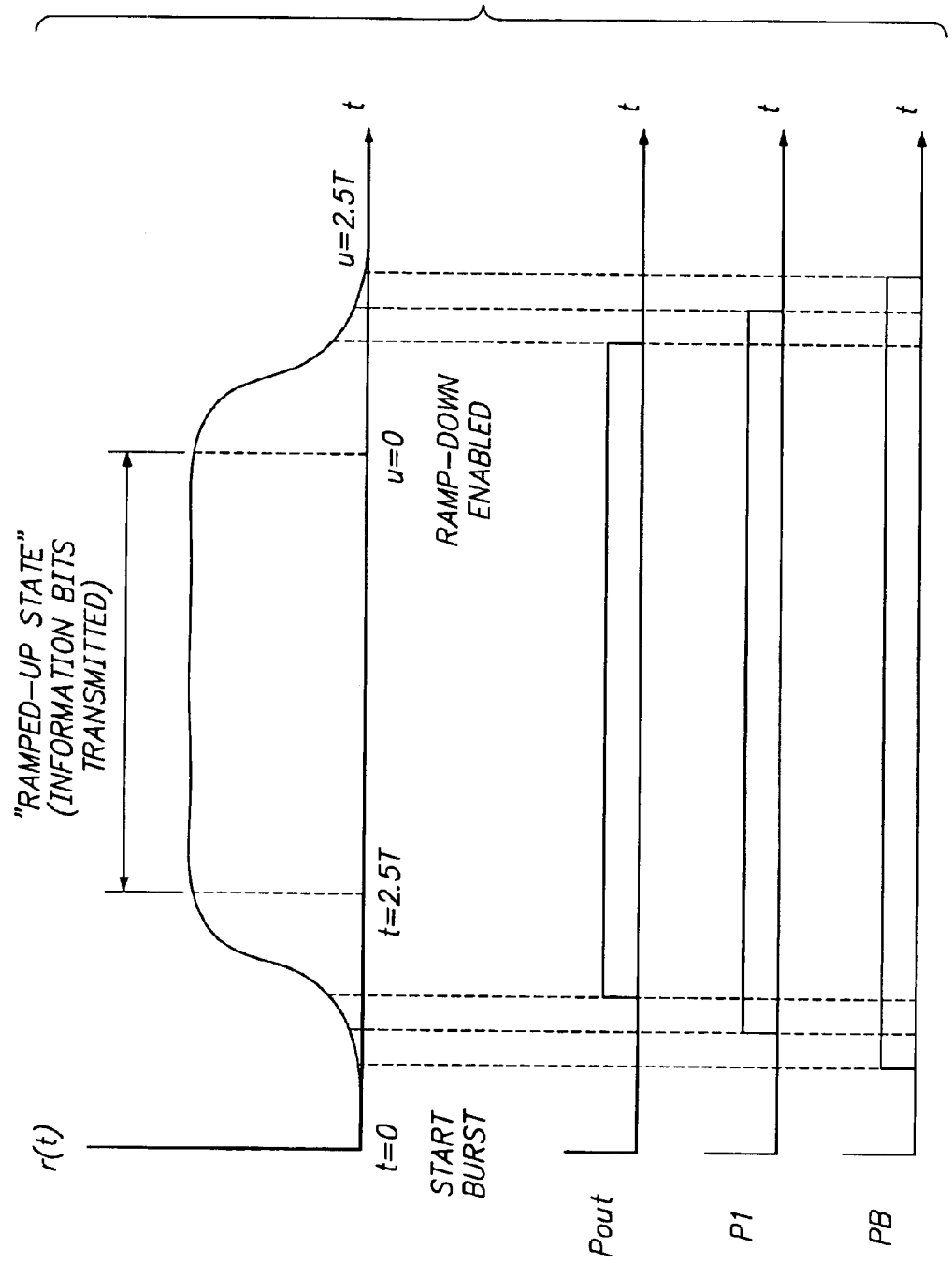
FIG. 19 is a timing diagram illustrating operation of the transmitter of FIG. 18.

Signals PB, P1 and Pout are used to power on and power off the buffer amplifier 1833, the first and second power amplifier stages 1820a and 1820b, and the driver circuit 1825, respectively. The timing of these signals relative to the rising edge ramp and falling edge ramp is important to control, in order to obtain good transient spectrum performance (little or no glitching caused by poorly-timed turn-on or turn-off effects). As previously described, the desired ramping amplitude characteristics may be obtained from the amplitude of a modulator's output (e.g., a QAM modulator as in EDGE) or from a ramp generator (e.g., as in GMSK). Additional timing logic is provided to generate PB, P1 and Pout as required. The implementation of such logic will be clear to those skilled in the art from the timing diagram of FIG. 19, showing the desired relationship between these signals and others previously described. Whereas FIG. 19 illustrates the example of GMSK, similar relationships hold between the signals PB, P1 and Pout and the timing signals of the EDGE example (e.g., the signal or counter used to control the input selector).

Referring now to FIG. 19, it may be seen that amplifiers turn on sequentially and turn off in the reverse sequence, according to their order (FIG. 18) between the frequency modulator and the RF output. To achieve the highest quality signal, the switching points for PB, P1 and Pout should be selected to correspond to low amplitude times in r(t), so that the associated switching transient is small. Optionally, the wasting of power may be avoided by minimizing the "on" time of each of the signals PB, P1 and Pout. This objective may be achieved, as illustrated in FIG. 19, by not switching PB, P1 and Pout on until r(t) is already non-zero on the ramp up, and by switching the same signals off before r(t) has reached zero on the ramp down.

Beyond the general timing relationships illustrated in FIG. 19, in any particular implementation, more exact timing relationships may be adjusted empirically to optimize transient spectral performance and temporal compactness. This process may be facilitated using "soft" or programmable timing logic, and need be done only once for a given implementation (not re-done for every unit during manufacture).

Thus there has been described a polar modulator architecture, amenable to a high level of integration, that enables ramping of both QAM (e.g., EDGE, D-AMPS) and non-QAM (e.g, GMSK) signals, and enabling glitch-free on-the-fly switching between different modulations (e.g., EDGE and GMSK). No unit-by-unit calibration is required, allowing ramp shapes to be fixed at design time. Timing control signals can also be fixed at design time, since they relate mainly to digital events or conditions. The particular ramping methods described produce narrow rising and falling edge ramps and very low transients (i.e., very good transient spectrum characteristics).

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of controlling ramping of a communications signal including amplitude modulation between two states including a state of minimal output power of the communications signal during which no information is conveyed and a state in of greater output power in which information is conveyed, the method comprising:
  adding a predetermined sequence of symbols to a sequence of information symbols to be communicated to form an augmented sequence of symbols; and
  performing modulation of the augmented sequence of symbols to produce an envelope signal that exhibits a desired ramp profile,
wherein adding said predetermined sequence of symbols is performed in a manner that ensures a transient spectrum of the envelope signal during ramping is no worse than the transient spectrum during information bearing modulation.

2. The method of claim 1, comprising modulating a carrier signal in accordance with the envelope signal.

3. The method of claim 1, wherein the predetermined sequence of symbols is a sequence of zero-valued symbols.

4. The method of claim 3, wherein the communications signal is a Quadrature Amplitude Modulation signal.

5. The method of claim 4, wherein the communications signal is an EDGE communications signal.

6. The method of claim 4, wherein the communications signal is a D-AMPS communications signal.

7. The method of claim 1, wherein the envelope signal is represented in digital form as samples having a sample rate.

8. The method of claim 7, comprising altering the sample rate during at least a portion of a ramping period.

9. The method of claim 8, wherein the sample rate is increased, resulting in ramp acceleration.

10. A method of controlling ramping of a communications signal including amplitude modulation between two states including a state of minimal output power of the communications signal during which no information is conveyed and a state in or greater output power in which information is conveyed, the method comprising producing an envelope signal having a ramp-up portion, a ramp-down portion, and a flat portion between the ram-up portion and the ramp-down portion wherein:
  the ramp-up portion is produced based on a first half of a communications pulse signal, a squared magnitude of the Fourier transform of the communications pulse signal being approximately proportional to the power spectrum of the communications signal; and
  the ramp-down portion is produced based on a second half of the communications pulse signal.

11. The method of claim 10, wherein the communications signal is a constant-envelope communications signal.

12. The method of claim 11, wherein the communications signal is a GMSK communications signal.

13. The method of claim 12, wherein the communications pulse signal is one used to generate EDGE communications signals.

14. The method of claim 10, comprising modulating a carrier signal in accordance with the envelope signal.

15. The method of claim 14, wherein the carrier signal is modulated in accordance with the envelope signal using an amplifier having separate phase and amplitude paths, comprising applying the envelope signal to the amplitude path.

16. The method of claim 15, comprising operating the amplifier in switch mode.

17. Circuitry to controlling ramping of a communications signal including amplitude modulation between two states including a state of minimal output power of the communications signal during which no information is conveyed and a state of greater output power in which information is conveyed, the circuitry comprising:
  means for adding a predetermined sequence of symbols to a sequence of information symbols to be communicated to form an augmented sequence of symbols;
  a first modulator for performing modulation of the augmented sequence of symbols to produce an envelope signal that exhibits a desired ramp profile; and
  a polar modulator operable to modulate a carrier signal in accordance with said envelope signal.

18. The apparatus of claim 17, wherein the predetermined sequence of symbols is a sequence of zero-valued symbols.

19. The apparatus of claim 18, wherein the communications signal is a Quadrature Amplitude Modulation signal.

20. The apparatus of claim 19, wherein the communications signal is an EDGE communications signal.

21. The apparatus of claim 19, wherein the communications signal is a D-AMPS communications signal.

22. The apparatus of claim 17, wherein the envelope signal is represented in digital form as samples having a sample rate.

23. The apparatus of claim 22, comprising means for altering the sample rate during at least a portion of a ramping period.

24. The apparatus of claim 23, wherein the sample rate is increased, resulting in ramp acceleration.

25. A ramp generator for controlling ramping of a communications signal including amplitude modulation between two states including a state of minimal output power of the communications signal during which no information is conveyed and a state in of greater output power in which information is conveyed, by producing an envelope signal having a ramp-up portion, a ramp-down portion, and a flat portion between the ramp-up portion and the ramp-down portion, comprising:
  storage for storing first values corresponding to the ramp-up portion, the first values being based on a first half of a communications pulse signal, and for storing second values corresponding to the ramp-down portion, the second values being based on a second half of the communications pulse signal, a squared magnitude of the Fourier transform of the communications pulse signal being approximately proportional to the power spectrum of the communications signal; and
  control circuitry responsive to timing signals for causing the first values to be read out during a ramp-up interval and for causing the second values to be read out during a ramp-down interval.

26. The apparatus of claim 25, wherein the communications signal is a constant-envelope communications signal.

27. The apparatus of claim 26, wherein the communications signal is a GMSK communications signal.

28. The apparatus of claim 27, wherein the communications pulse signal is one used to generate EDGE communications signals.

29. The apparatus of claim 26, comprising a modulator for modulating a carrier signal in accordance with the envelope signal.

30. The apparatus of claim 29, wherein the modulator comprises an amplifier having separate phase and amplitude paths, the carrier signal being applied to the phase path and the envelope signal being applied to the amplitude path.

31. The apparatus of claim 30, wherein the amplifier is operated in switch mode.

32. A method of improving the transient adjacent channel power performance of a communications transmitter, comprising adding a predetermined sequence of symbols to the beginning or end of a sequence of information symbols transmitted in an amplitude path of a communications transmitter to form an augmented sequence of symbols;

using said augmented sequence of symbols to form a ramp signal; and applying said ramp signal to an amplitude input of a non-linear power amplifier, wherein adding the predetermined sequence of symbols is used to ensure that the transient adjacent channel power associated with an RF output signal of the non-linear power amplifier during ramp-up or ramp-down does not violate a predetermined specification.

33. The method of claim 32 wherein the predetermined sequence of symbols is a sequence of zero-valued symbols.

* * * * *